United States Patent
Cesaretti et al.

(10) Patent No.: US 9,638,764 B2
(45) Date of Patent: May 2, 2017

(54) ELECTRONIC CIRCUIT FOR DRIVING A HALL EFFECT ELEMENT WITH A CURRENT COMPENSATED FOR SUBSTRATE STRESS

(71) Applicant: Allegro MicroSystems, LLC, Worcester, MA (US)

(72) Inventors: Juan Manuel Cesaretti, Ciudad de Buenos Aires (AR); Aaron Cook, Deerfield, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 0 days.

(21) Appl. No.: 14/681,575

(22) Filed: Apr. 8, 2015

(65) Prior Publication Data
US 2016/0299199 A1 Oct. 13, 2016

(51) Int. Cl.
*G01R 33/07* (2006.01)
*G01R 33/00* (2006.01)

(52) U.S. Cl.
CPC ..... *G01R 33/0023* (2013.01); *G01R 33/0041* (2013.01); *G01R 33/0052* (2013.01); *G01R 33/07* (2013.01); *G01R 33/075* (2013.01)

(58) Field of Classification Search
CPC ...... G01R 33/07; G01R 33/02; G01R 33/072; G01R 33/093; G01R 33/096;
(Continued)

(56) References Cited

U.S. PATENT DOCUMENTS

| 4,236,832 A | 12/1980 | Komatsu et al. |
| 4,438,347 A | 3/1984 | Gehring |

(Continued)

FOREIGN PATENT DOCUMENTS

| CN | 1501093 A | 6/2004 |
| CN | 101023367 A | 8/2007 |

(Continued)

OTHER PUBLICATIONS

Ackermann et al.; "New Generation of Hall-effect Based Current Sensor: Evolution from Core-based to Integrated;" M. Sc. Laurent Coulot, Melexis Technologies, A.G.Bevaix; Apr. 1, 2015; 8 pages.
(Continued)

*Primary Examiner* — Patrick Assouad
*Assistant Examiner* — Taqi Nasir
(74) *Attorney, Agent, or Firm* — Daly, Crowley, Mofford & Durkee, LLP (57) ABSTRACT

An electronic circuit can be disposed upon a semiconductor substrate. An epitaxial layer can be disposed over the semiconductor substrate. The electronic circuit can include a Hall effect element, at least a portion of the Hall effect element disposed in the epitaxial layer. The electronic circuit can further include a current generator configured to generate a drive current that passes through the Hall effect element. The current generator can include a resistor disposed in the epitaxial layer and having characteristics such that a resistance of the resistor can vary with a stress of the semiconductor substrate, resulting in changes of the drive current, to compensate for variations in the sensitivity of the Hall effect element with the stress of the substrate.

25 Claims, 5 Drawing Sheets

(58) Field of Classification Search
CPC ............ G01R 15/202; H01L 51/0072; H01L 51/5056; H01L 51/0067; G01D 5/14; G01D 5/12; G01D 5/142; G01D 5/20
USPC ............ 324/251, 244, 76.77, 207.2, 207.21, 324/207.22, 207.23, 207.24–207.26, 324/200–206, 301, 248, 249, 250, 253, 324/256, 258; 338/32 H
See application file for complete search history.

(56) References Cited

U.S. PATENT DOCUMENTS

| | | | |
|---|---|---|---|
| 4,752,733 A | 6/1988 | Petr et al. | |
| 4,758,943 A | 7/1988 | Aström et al. | |
| 4,760,285 A | 7/1988 | Nelson | |
| 4,823,075 A | 4/1989 | Alley | |
| 4,833,406 A | 5/1989 | Foster | |
| 4,970,411 A | 11/1990 | Halg et al. | |
| 5,247,278 A | 9/1993 | Pant et al. | |
| 5,285,155 A | 2/1994 | Ueda et al. | |
| 5,329,416 A | 7/1994 | Ushiyama et al. | |
| 5,343,143 A | 8/1994 | Voisine et al. | |
| 5,412,255 A | 5/1995 | Wallrafen | |
| 5,424,558 A | 6/1995 | Borden et al. | |
| 5,469,058 A | 11/1995 | Dunnam | |
| 5,521,501 A | 5/1996 | Dettmann et al. | |
| 5,614,754 A | 3/1997 | Inoue | |
| 5,621,319 A | 4/1997 | Bilotti et al. | |
| 5,640,090 A | 6/1997 | Furuya et al. | |
| 5,652,445 A | 7/1997 | Johnson | |
| 5,844,140 A | 12/1998 | Seale | |
| 6,011,770 A | 1/2000 | Tan | |
| 6,351,506 B1 | 2/2002 | Lewicki | |
| 6,392,478 B1 | 5/2002 | Mulder et al. | |
| 6,436,748 B1 | 8/2002 | Forbes et al. | |
| 6,437,558 B2 | 8/2002 | Li et al. | |
| 6,441,460 B1 | 8/2002 | Viebach | |
| 6,639,290 B1 | 10/2003 | Hohe et al. | |
| 6,750,644 B1 | 6/2004 | Berkcan | |
| 6,853,178 B2 | 2/2005 | Hayat-Dawoodi | |
| 6,896,407 B2 | 5/2005 | Nomiyama et al. | |
| 6,917,321 B1 | 7/2005 | Haurie et al. | |
| 7,038,448 B2 | 5/2006 | Schott et al. | |
| 7,190,784 B2 | 3/2007 | Li | |
| 7,259,545 B2 | 8/2007 | Stauth et al. | |
| 7,292,095 B2 | 11/2007 | Burt et al. | |
| 7,319,319 B2 | 1/2008 | Jones et al. | |
| 7,323,870 B2 | 1/2008 | Tatschl et al. | |
| 7,325,175 B2 | 1/2008 | Momtaz | |
| 7,339,245 B2 | 3/2008 | Mueller | |
| 7,345,470 B2 | 3/2008 | Suzuki | |
| 7,425,821 B2 | 9/2008 | Monreal et al. | |
| 7,474,093 B2 | 1/2009 | Ausserlechner | |
| 7,518,354 B2 | 4/2009 | Stauth et al. | |
| 7,598,601 B2 | 10/2009 | Taylor et al. | |
| 7,605,647 B1 | 10/2009 | Romero et al. | |
| 7,635,993 B2 | 12/2009 | Boeve | |
| 7,694,200 B2 | 4/2010 | Forrest et al. | |
| 7,701,208 B2 | 4/2010 | Nishikawa | |
| 7,729,675 B2 | 6/2010 | Krone | |
| 7,746,056 B2 | 6/2010 | Stauth et al. | |
| 7,746,065 B2 | 6/2010 | Pastre et al. | |
| 7,764,118 B2 | 7/2010 | Kusuda et al. | |
| 7,769,110 B2 | 8/2010 | Momtaz | |
| 7,800,389 B2 | 9/2010 | Friedrich et al. | |
| 7,872,322 B2 | 1/2011 | Schott et al. | |
| 7,923,996 B2 | 4/2011 | Doogue et al. | |
| 7,936,029 B2 | 5/2011 | Wang | |
| 7,936,144 B2 | 5/2011 | Vig et al. | |
| 7,961,823 B2 | 6/2011 | Kolze et al. | |
| 7,990,209 B2 | 8/2011 | Romero | |
| 8,030,918 B2 | 10/2011 | Doogue et al. | |
| 8,128,549 B2 | 3/2012 | Testani et al. | |
| 8,134,358 B2 | 3/2012 | Charlier et al. | |
| 8,203,329 B2 | 6/2012 | Hohe et al. | |
| 8,357,983 B1 | 1/2013 | Wang | |
| 8,447,556 B2 | 5/2013 | Friedrich et al. | |
| 2002/0084923 A1 | 7/2002 | Li | |
| 2003/0038675 A1 | 2/2003 | Gailus et al. | |
| 2003/0102909 A1 | 6/2003 | Motz | |
| 2006/0202692 A1 | 9/2006 | Tatschl et al. | |
| 2007/0110199 A1 | 5/2007 | Momtaz et al. | |
| 2007/0222433 A1* | 9/2007 | Tiernan .............. G01R 33/5617 324/207.21 |
| 2007/0247141 A1 | 10/2007 | Pastre et al. | |
| 2007/0285089 A1 | 12/2007 | Ibuki et al. | |
| 2008/0094055 A1 | 4/2008 | Monreal et al. | |
| 2008/0110987 A1 | 5/2008 | Cato et al. | |
| 2008/0137784 A1 | 6/2008 | Krone | |
| 2008/0238410 A1 | 10/2008 | Charlier et al. | |
| 2008/0265880 A1 | 10/2008 | Nishikawa | |
| 2009/0001964 A1 | 1/2009 | Strzalkowski et al. | |
| 2009/0001972 A1 | 1/2009 | Fernandez et al. | |
| 2009/0085706 A1 | 4/2009 | Baarman et al. | |
| 2009/0108839 A1* | 4/2009 | Ausserlechner ........ G01L 5/162 324/251 |
| 2009/0212765 A1 | 8/2009 | Doogue et al. | |
| 2010/0117638 A1 | 5/2010 | Yamashita et al. | |
| 2010/0211347 A1 | 8/2010 | Friedrich et al. | |
| 2011/0018533 A1 | 1/2011 | Cesaretti et al. | |
| 2011/0048102 A1 | 3/2011 | Fernandez et al. | |
| 2011/0298448 A1 | 12/2011 | Foletto et al. | |
| 2012/0016614 A1 | 1/2012 | Hohe et al. | |
| 2012/0112695 A1 | 5/2012 | Nishi et al. | |
| 2012/0274314 A1 | 11/2012 | Cesaretti et al. | |
| 2012/0313635 A1 | 12/2012 | Daubert | |
| 2013/0093412 A1 | 4/2013 | Anelli et al. | |
| 2013/0285651 A1* | 10/2013 | Wan ..................... H01L 27/22 324/249 |
| 2014/0009221 A1* | 1/2014 | Motz ................. G01R 33/0029 327/564 |
| 2015/0028871 A1* | 1/2015 | Suijver ................. G01R 33/30 324/318 |

FOREIGN PATENT DOCUMENTS

| | | |
|---|---|---|
| CN | 200986484 Y | 12/2007 |
| DE | 195 39 458 A1 | 4/1997 |
| DE | 196 06 826 A1 | 8/1997 |
| DE | 10 2005 047 413 A1 | 9/2006 |
| DE | 10 2006 037 226 A | 2/2008 |
| DE | 10 2007 041 230 B3 | 4/2009 |
| EP | 0 289 414 A2 | 11/1988 |
| EP | 0 289 414 A3 | 11/1988 |
| EP | 0 338 122 | 10/1989 |
| EP | 0 357 013 A2 | 3/1990 |
| EP | 0 357 013 A3 | 3/1990 |
| EP | 1 637 898 A1 | 3/2006 |
| EP | 1 679 524 A1 | 7/2006 |
| EP | 1 850 143 A1 | 10/2007 |
| GB | 2 276 727 A | 10/1994 |
| JP | S 6148777 A | 3/1986 |
| JP | SHO 61-48777 | 3/1986 |
| JP | S 63-11675 Y2 | 4/1988 |
| JP | H03-176682 | 7/1991 |
| JP | H03-248611 A | 11/1991 |
| JP | 2000-55999 A | 2/2000 |
| JP | 2002-213992 A | 7/2002 |
| JP | 2004-177228 A | 6/2004 |
| JP | 2004-234589 A | 8/2004 |
| JP | 2006-123012 A | 5/2006 |
| JP | A 2006126012 A | 5/2006 |
| JP | 2008-513762 A | 5/2008 |
| JP | 4840481 B2 | 1/2011 |
| JP | 2011-052036 A | 3/2011 |
| KR | 10-2007-0060096 A | 6/2007 |
| TW | 200640135 | 11/2006 |
| WO | WO 96/02849 A1 | 2/1996 |
| WO | WO 2004/072672 | 8/2004 |
| WO | WO 2006/035342 A1 | 4/2006 |
| WO | WO 2006/056829 | 6/2006 |
| WO | WO 2007/138508 A1 | 12/2007 |
| WO | WO 2008/048379 A1 | 4/2008 |

(56) References Cited

FOREIGN PATENT DOCUMENTS

| WO | WO 2008/123144 A1 | 10/2008 |
|---|---|---|
| WO | WO 2009/108422 A2 | 9/2009 |
| WO | WO 2009/108422 A3 | 9/2009 |
| WO | WO 2010/096367 A1 | 8/2010 |
| WO | WO 2011/011479 | 1/2011 |

OTHER PUBLICATIONS

Huber et al.; "Package Stress Monitor to Compensate for the Piezo-Hall Effect in CMOS Hall Sensors;" 2012 IEEE Sensors; Oct. 2012; 4 pages.
Huber et al.; "Package Stress Monitor to Compensate for the Piezo-Hall Effect in CMOS Hall Sensors;" IEEE Sensors Journal, vol. 13, No. 8; Aug. 2013; pp. 2890-2898.
Kanda; "A Graphical Representation of the Piezoresistance Coefficients in Silocon;" IEEE Transactions on Electron Devices; vol. Ed-29, vol. 1; Jan. 1982; pp. 64-70.
Krammerer et al.; "A Hall Effect Sensors Network Insensitive to Mechanical Stress;" Proceedings of IEEE Sensors; Oct. 2004; 4 pages.
Motz et al.; "A Miniature Digital Current Sensor with Differential Hall Probes Using Enhanced Chopping Techniques and Mechanical Stress Compensation;" IEEE Sensors; Oct. 2012; 4 pages.
Randjelovic et al.; "Highly Sensitive Hall Magnetic Sensor Microsystems in CMOS Technology;" IEEE Journal of Solid-State Circuits, vol. 37, No. 2; Feb. 2002; pp. 151 to 159.
Steiner et al.; "Double-Hall Sensor with Self-Compensated Offset;" IEDM 97 Technical Digest, Steiner Electron Devices Meeting; Dec. 1997; pp. 36.6.1 to 36.6.4.
van der Meer et al; "CMOS Quad-Spinning-Current Hall-Sensor System for Compass Application;" Proceedings of IEEE Sensors, vol. 3; Oct. 2004; pp. 1434-1437.
Korean Notice of Allowance dated Jul. 31, 2015; for Korean Pat. App. No. 10-2014-7033792; 5 pages.
Letter from Yuasa and Hare dated Jan. 28, 2016; For Japanese Pat. App. No. JP 2015,-013206; 3 pages.
Japanese Notice of Reasons for Rejection dated Jan. 4, 2016; For Japanese Pat. App. No. 2015-013206; 7 pages.
Japanese Allowed Claims received May 25, 2015; for Japanese Pat. App. No. 2010-547666; 5 pages.
Korean Notice of Allowance with Allowed Claims (English Translation); dated Apr. 20, 2015; for Korean Pat. App. No. 10-2010-7019498; 12 pages.
U.S. Appl. No. 15/066,331, filed Mar. 10, 2016, Cesaretti.
PCT International Search Report and Written Opinion dated Jul. 20, 2016 for International Application No. PCT/US2016/025495; 20 pages.
U.S. Appl. No. 13/969,702, filed Aug. 19, 2013, Cesaretti et al.
U.S. Appl. No. 13/743,451, filed Jan. 17, 2013, Friedrich et al.
Allegro Microsystems, LLC; A3981 Automotive, Programmable Stepper Driver; datasheet; Jan. 2013; 43 pages.
Ausserlechner et al.; "Compensation of the Piezo-Hall Effect in Integrated Hall Sensors on (100)-Si;" IEEE Sensors Journal, vol. 7, No. 11; Nov. 2007; ISBN: 1530-437X; pp. 1475-1482.
Ausserlechner et al.; "Drift of Magnetic Sensitivity of Small Hall Sensors Due to Moisture Absorbed by the IC-Package;" Proceedings of IEEE Sensors, 2004; vol. 1; Oct. 24, 2004; ISBN:0-7803-8692-2; pp. 455-458.
Ausserlechner; "Limits of Offset Cancellation by the Principle of Spinning Current Hall Probe;" Proceedings of IEEE Sensors; Oct. 2004; pp. 1117-1120.
Ausserlechner; "The piezo-Hall effect in n-silicon for arbitrary crystal orientation;" Proceedings of IEEE Sensors; vol. 3; Oct. 24, 2004; ISBN: 0-7803-8692-2; pp. 1149-1152.
Bahreyni, et al.; "A Resonant Micromachined Magnetic Field Sensor;" IEEE Sensors Journal; vol. 7, No. 9, Sep. 2007; pp. 1326-1334.

Barrettino, et al.; "CMOS-Based Monolithic Controllers for Smart Sensors Comprising Micromembranes and Microcantilevers;" IEEE Transactions on Circuits and Systems-I Regular Papers vol. 54; No. 1; Jan. 2007; pp. 141-152.
Baschirotto et al.; "Development and Analysis of PCB Vector 2-D Magnetic Field Sensor System for Electronic Compass;" IEEE Sensors Journal vol. 6, No. 2; Apr. 2006; pp. 365-371.
Bilotti et al.; "Monolithic Magnetic Hail Sensor Using Dynamic Quadrature Offset Cancellation;" IEEE Journal of Solid-State Circuits; vol. 32, Issue 6; Jun. 1997; pp. 829-836.
Blagojevic et al.; "FD SOI Hall Sensor Electronics Interfaces for Energy Measurement:" Microelectronics Journal 37; Sep. 2006; pp. 1576-1583.
Cesaretti et al.; "Effect of Stress Due to Plastic Package Moisture Absorption in Hall Sensors;"IEEE Transactions on Magnets; vol. 45; No. 10; Oct. 2009; pp. 4482-4485.
Demierre, et al.; "Reference Magnetic Actuator for Self-Calibration of a Very Small Hall Sensor Array;" Sensors and Actuators A97-98; Apr. 2002; pp. 39-46.
Frick, et al.; "CMOS Microsystem for AC Current Measurement with Galvanic Isolation:" IEEE Sensors Journal; vol. 3, No. 6; Dec. 2003; pp. 752-760.
Halg; "Piezo-Hall Coefficients of n-Type Silicon;" Journal of Applied Physics; vol. 64; No. 1; Jul. 1, 1988; pp. 276-282.
Hosticka; "CMOS Sensor Systems;" Sensors and Actuators A66; Apr. 1998; pp. 335-341.
Kanda et al.; "The Piezo-Hall Effect in n-Silicon" $22^{nd}$ International Conference on the Physics of Semiconductors; vol. 1, Jan. 1995; pp. 89-92.
Kayal et al.; "Automatic Calibration of Hall Sensor Microsystems;" Microelectronics Journal 37; Sep. 2006; pp. 1569-1575.
Krammerer et al.; "A Hall effect sensors network insensitive to mechanical stress;" Proceedings of IEEE Sensors; vol. 3, Oct. 2004; pp. 1071-1074.
Mangnani et al.; "Mechanical Stress Measurement Electronics Effects;" $9^{th}$ International Conference on Electronics, Circuits and Systems 2002; vol. 1; SBN: 0-7803-7596-3; Dec. 2002; pp. 363-366.
Manic et al; "Short and Long-Term Stability Problems of Hall Plates in Plastic Packages;" IEEE $38^{th}$ Annual International Reliability Physics Symposium; Apr. 2000; pp. 225-230.
Manic; "Drift in Silicon Integrated Sensors and Circuits Due to the Thermo-Mechanical Stresses;" Lausanne, Ecole Polytechnique Fédérale De Lausanne 200; 176 pages.
Motz et al.; "An Integrated Magnetic Sensor with Two Continuous-Time ΔΣ-Converters and Stress Compensation Capability;" IEEE International Solid-State Conference; Digest of Technical Papers; Feb. 6, 2006; ISBN: 14244-0079-1; pp. 1151-1160.
Motz, et al.; "A Chopped Hall Sensor with Small Jitter and Programmable "True Power-On"Function;" IEEE Journal of Solid-State Circuits; vol. 40, No. 7; Jul. 2005; pp. 1533-1540.
Motz, et al.; "An Integrated Hall Sensor Platform Design for Position, Angle and Current Sensing;" IEEE Sensors 2006; Exco, Daegu, Korea / Oct. 22-25, 2006; pp. 1008-1011.
Munter; "A Low-offset Spinning-current Hall Plate;" Sensors and Actuators A21-A23; 1990; pp. 742-746.
Munter; "Electronic Circuitry for a Smart Spinning-current Hall Plate with Low Offset;" Sensors and Actuators A; Jun. 1991 ; pp. 747-751.
Partin et al.; "Temperature Stable Hall Effect Sensors;" IEEE Sensors Journal, vol. 6, No. 1; Feb. 2006; pp. 106-110.
Pastre, et al.; "A Hall Sensor Analog Front End for Current Measurement with Continuous Gain Calibration;" IEEE Sensors Journal; vol. 7, No. 5; May 2007; pp. 860-867.
Pastre, et al.; "A Hall Sensor-Based Current Measurement Microsystem With Continuous Gain Calibration;" Research in Microelectronics and Electronics, IEEE vol. 2; Jul. 25, 2005; ISBN: 0-7803-9345-7; pp. 95-98.
Popovic; "Sensor Microsystems;" Proc. $20^{th}$ International Conference on Microelectronics (MWIL 95); vol. 2, NIS, Serbia, 12-14; Sep. 1995; pp. 531-537.

(56) References Cited

OTHER PUBLICATIONS

Randhawa; "Monolithic Integrated Hall Devices in Silicon Circuits;" Microelectronics Journal; vol. 12, No. 6; Sep. 14-17, 1981; pp. 24-29.
Ruther et al.; "Integrated CMOS-Based Sensor Array for Mechanical Stress Mapping;" 5th IEEE Conference on Sensors, Oct. 2007; pp. 1131-1134.
Ruther et al.; "Theromagnetic Residual Offset in Integrated Hall Plates;" IEEE Sensors Journal; vol. 3, No. 6; Dec. 2003; pp. 693-699.
Sargent; "Switched-capacitor IC controls feedback loop;" EDN; Design Ideas; Feb. 17, 2000; pp. 154 and 156.
Schneider, et al.; "Temperature Calibration of CMOS Magnetic Vector Probe for Contactless Angle Measurement System;" IEDM; Dec. 1996; pp. 533-536.
Schott et al.; "Linearizing Integrated Hall Devices;" 1997 International Conference on Solid-State Sensors and Actuators, Jun. 16-19, 1997; pp. 393-396.
Schott, et al.; "CMOS Single-Chip Electronic Compass with Microcontroller;" IEEE Journal of Solid-State Circuits; vol. 42, No. 12; Dec. 2007; pp. 2923-2933.
Simon et al.; "Autocalibration of Silicon Hall Devices;" 8th International Conference on Sensors and Actuators; vol. 2; Jun. 25, 1995; pp. 237-240.
Steiner et al; Offset Reduction in Hall Devices by Continuous Spinning Current Method; Sensors and Actuators A66; 1998; pp. 167-172.
Steiner: "Double-Hall Sensor with Self-Compensated Offset" Electron Devices Meeting; IDSM '97 Technical Digest; Dec. 7-10, 1997; pp. 911-914.
Stellrecht et al.; Characterization of Hygroscopic Swelling Behavior of Mold Compounds and Plastic Packages; IEEE Transactions on Components and Packaging Technologies; vol. 27, No. 3; Sep. 2004; pp. 499-506.
Tian et al.; "Multiple Sensors on Pulsed Eddy-Current Detection for 3-D Subsurface Crack Assessment;" IEEE Sensors Journal, vol. 5, No. 1; Feb. 2005; pp. 90-96.
Tronteij et al; "CMOS Integrated Magnetic Field Source Used as a Reference in Magnetic Field Sensors on Common Substrate;" WEP 1-6; IMTC; May 1994; pp. 461-463.
Wu, et al.; "A Chopper Current-Feedback Instrumentation Amplifier with a 1mHz 1/f Boise Corner and an AC-Coupled Ripple-Reduction Loop;" IEEE International Solid-State Circuits Conference; Feb. 10, 2009; pp. 322-324.
Zou et al.; "Three-Dimensional Die Surface Stress Measurements in Delaminated and Non-Delaminated Plastic Packages;" 48th Electronic Components and Technology Conference; May 25, 1998; pp. 1223-1234.
Chinese Office Action (Translated into English); dated Aug. 29, 2012; for Chinese Pat. App. No. 200980106535.4; 4 pages.
Chinese Office Action; dated Aug. 20, 2012; for Chinese Pat. App. No. 200980106535.4; 4 pages.
Letter from NTD Patent & Trademark Agency Limited; dated Oct. 10, 2012; for Chinese Pat. App. No. 200980106535.4; 13 pages.
Letter to NTD Patent and Trademark Agency Ltd.; dated Dec. 11, 2012; with instructions to file Response to Official Action; for Chinese Pat. App. No. 200980106535,4; 3 pages.
Letter from NTD Patent and Trademark Agency Ltd.; dated Jan. 19, 2013; enclosing Response to Official Action; for Chinese Pat. App. No. 200980106535.4; 14 pages.
Chinese Office Action dated Apr. 15, 2013 (with English translation); for CN Pat. App. No. 200980106535.4 4 pages.
Letter to NTD Patent and Trademark Agency; dated Jun. 19, 2013; for Chinese Pat. App. No. 200980106535.4; 11 pages.
Chinese Response to Office Action; Jul. 11, 2013; for Chinese Pat. App. No. 200980106535.4; 12 pages.
Letter from NTD Patent and Trademark Agency; dated Jul. 11, 2013; for Chinese Pat. App. No. 200080106535.4; 1 page.
Chinese Office Action dated Nov. 7, 2013 (w/English translation); for Chinese Pat. App. No. 200980106535.4; 9 pages.

Claims from Chinese Office Action dated Nov. 7, 2013 (w/English translation); for Chinese Pat. App. No. 200980106535,4; 8 pages.
Letter to NTD Patent and Trademark Agency, Ltd. dated Dec. 16, 2013; for Chinese Pat. App. No. 200980108535.4; 10 pages.
Letter from NTD Patent and Trademark Agency, Ltd. dated Jan. 2014; for Chinese Pat. App. No. 200080106535.4; 1 page.
Response to Office Action received Jan. 7, 2014; for Chinese Pat. App. No. 200980106535.4; 10 pages.
Chinese Notice of Completing Formalities (including English translation) and Search Report dated Mar. 7, 2014; for Chinese Pat. App. No. 200980106535.4; 8 pages.
Japanese Notice of Reasons for Rejection (English translation); dated Apr. 4, 2013; for JP Pat. App. No. 2010-547660; 4 pages.
Letter from Yuasa & Hara; dated May 27, 2013; for JP Pat. App. No. 2010-547666; 2 pages.
Argument and Amendment (in Japanese); dated Jul. 3, 2013; for Japanese Pat. App. No. 2010-547666; 6 pages.
Claims for Argument and Amendment (in English); dated Jul. 3, 2013; for Japanese Pat. App. No. 2010-547666; 5 pages.
Letter from Yuasa and Hara; dated Oct. 8, 2013; for Japanese Pat. App. No. 2010-547666; 2 pages.
Japanese Notice of Reasons for Rejection (English translation) dated Nov. 26, 2013; for JP Pat. App. No. 2010-547666; 2 pages.
Japanese Notice of Reasons for Rejection dated Sep. 29, 2014; for Japanese Pat. App. No. 2010-547666; 4 pages.
Letter to Yuasa and Hara dated Jan. 9, 2015; for Japanese Pat. App. No. 2010-547666; 6 pages.
Claims filed Jan. 27, 2015 in Response to Japanese Office Action; for Japanese Pat. App. No. 2010-547666; 5 pages.
Korean Notice to Submit a Response (with English translation) dated Sep. 30, 2014; for Korean Pat. App. No. 10-2010-7019498; 10 pages.
Letter to 21st Century Patent & Law Firm dated Nov. 18, 2014; for Korean Pat. App. No. 10-2010-7019498; 36 pages.
Korean Response to Notice of Reasons for Refusal dated Dec. 1, 2014; for Korean Pat. App. No. 10-2010-7019498; 31 pages.
Korean Notice to Submit a Response dated Jan. 30, 2015; for Korean Pat. App. No. 5-2002-043492-2; 6 pages.
Letter to 21st Century Patent & Law Firm dated Mar. 10, 2015; for Korean Pat. App. 10-2014-7033792; 2 pages.
Korean Response to Notice of Reasons for Refusal dated Mar. 23, 2015; for Korean Pat. App. No. 10-2014-7033792; 11 page.
Letter from 21st Century Patent & Law Firm dated Mar. 23, 2015; for Korean Pat. App. No. 10-2014-7033792; 1 page.
PCT Search Report and Written Opinion of the ISA for PCT/US2009/031776 dated Oct. 23, 2009.
PCT International Preliminary Report on Patentability and Written Opinion mailed Sep. 10, 2010 for PCT/US2009/031776.
Schweda et al.; "A Nonlinear Simulation Model for Integrated Hall Devices in CMOS Silicon Technology;" Proceedings of 2002 IEEE International Behavioral Modeling and Simulation, BMAS 2002; Oct. 6-8, 2002; pp. 1-7.
PCT Search Report and Written Opinion of the ISA dated Dec. 14, 2012; for PCT Pat. App. No. PCT/US2012/046635; 14 pages.
Letter from Yuasa and Nara dated Mar. 25, 2016; For Japanese Pat. App. No. 2015-013206; 1 page.
Response 2016 with English Claims dated Mar. 17, 2016 to Japanese Office Action; For Japanese Pat. App. No. 2015-013206; 7 pages.
U.S. Appl. No. 15/207,903, filed Jul. 12, 2016, Cesaretti.
Letter from Yuasa and Hara dated Dec. 14. 2018 regarding Appeal for JP Pat Appl. No. 2015-013206; 3 pages.
Translation of Current Claims on file (as amended on Aug. 29, 2016) for JP 2015-013206; 2 pages.
Letter from Japanese Associate dated Sep. 27, 2016 indicating Notice of Appeal filed in Japan and enclosing Current Claims dated Aug. 29, 2016; for Japanese Patent Application No. 2015-013206; 3 pages.
English Translation of Report of Re-Examination before Appeal dated Nov. 11, 2016 for JP Appl. No. 2015-013206; 3 pages.
Letter to Yuasa and Hara dated Feb. 17, 2017 for JP Appl. No. 2015-013206; 3 pages.

\* cited by examiner

FIG. 5

US 9,638,764 B2

ELECTRONIC CIRCUIT FOR DRIVING A HALL EFFECT ELEMENT WITH A CURRENT COMPENSATED FOR SUBSTRATE STRESS

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors, and, more particularly, to a magnetic field sensor having an electronic circuit for driving a Hall effect element with a drive current compensated for a stress in a substrate upon which the Hall effect element is disposed.

BACKGROUND

Hall effect elements are known. A typical planar or horizontal Hall effect element is a four terminal device for which a drive current (a DC current) is passed between two opposing ones of the four terminals and a differential voltage (AC or DC), responsive to a magnetic field (AC or DC), is generated between the other two opposing ones of the four terminals. An amplitude of the differential output signal (i.e., voltage) is related an amplitude of the drive current. Thus, a sensitivity (e.g., mV per Gauss) of the differential output signal is related to the amplitude of the drive current.

The Hall effect element can be used in current spinning or chopping arrangements in order to reduce a DC offset from the Hall effect element, which is typified by a non-zero output voltage from the Hall effect element even when experiencing a zero magnetic field. With current spinning or chopping, the terminals used to pass the drive current and the terminals used to generate the differential output signal can be changed at a current spinning rate in a periodic and cyclic manner. There can be two such changes per cycle with two-phase current spinning or four such changes with four-phase current spinning.

In order to maintain a constant and stable sensitivity, the drive current can be generated with a stable current source or a current sink that uses a stable reference voltage. However, various parameters can cause the sensitivity to magnetic fields of the differential output signal to change.

In general, even with a perfectly stable drive current, the Hall effect element itself can experience sensitivity changes. The changes in sensitivity of the Hall effect element can result directly from temperature changes. In order to correct for this sensitivity change, temperature can be sensed and the changes in sensitivity with temperature can be corrected.

However, the changes in sensitivity of the differential output signal can also result from stresses upon a substrate on which the Hall effect element is disposed. The stresses may or may not be related to temperature and also may or may not be related to a thermal coefficient of a material of a package used to seal the substrate. The stresses and resulting changes in sensitivity may vary from unit to unit in different ways with respect to temperature.

It would be desirable to provide an electronic circuit that can compensate for and correct changes in the sensitivity of a differential output signal generated by a Hall effect element that can result from stresses.

SUMMARY

The present invention provides an electronic circuit that can compensate for and correct changes in the sensitivity of a differential output signal generated by a Hall effect element that can result from stresses.

In accordance with an example useful for understanding an aspect of the present invention, an electronic circuit can include one or more of the following elements. The electronic circuit can include a semiconductor substrate having a surface. The electronic circuit can also include an epitaxial layer disposed over the surface of the semiconductor substrate, the epitaxial layer having a first surface distal from the semiconductor substrate and a second surface proximate to the semiconductor substrate. The electronic circuit can also include a Hall effect element, at least a portion of the Hall effect element disposed in the epitaxial layer. The electronic circuit can also include a current generator configured to generate a drive current that passes through the Hall effect element. The current generator can include a first resistor for receiving a reference voltage resulting in a reference current passing through the first resistor, the reference current related to the drive current, the first resistor disposed in the epitaxial layer, wherein a resistance of the first resistor, the reference current, and the drive current change in accordance with changes of a stress in the semiconductor substrate.

In accordance with another example useful for understanding an aspect of the present invention, a method of biasing a Hall effect element can include one or more of the following aspects. The method can include generating a reference current by generating a voltage reference across a resistor disposed in an epitaxial layer over a semiconductor substrate, the epitaxial layer having a first surface distal from the semiconductor substrate and a second surface proximate to the semiconductor substrate. The method can also include injecting a drive current into the Hall effect element, wherein the Hall effect element is disposed over the semiconductor substrate, wherein the drive current is related to the reference current, wherein a resistance of the resistor, the reference current, and the drive current change in accordance with changes of a stress in the semiconductor substrate.

BRIEF DESCRIPTION OF THE DRAWINGS

The foregoing features of the invention, as well as the invention itself may be more fully understood from the following detailed description of the drawings, in which.

DETAILED DESCRIPTION

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe an electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

The terms "parallel" and "perpendicular" may be used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/− ten degrees.

As used herein, the term "current generator" is used to describe either a current source or a current sink. It should be understood that a current source has a current output and a current sink has a current input, with a high output or input impedance, respectively.

As used herein, the term "current passing terminal" is used to describe a terminal of an active or passive electronic component that either receives a current or out of which a current comes. Thus, it will be appreciated that both a collector and emitter of a bipolar junction transistor (BJT) are current passing terminals. It will also be appreciated that both a source and a drain of the field effect transistor (FET) are current passing terminals.

As used herein, the term "substrate" is used to describe any type of structure with a flat surface upon which semiconductor materials can be deposited and/or into which semiconductor materials can be implanted and diffused. In some embodiments, the substrate is a P-type silicon substrate having a particular range of concentrations of P-type atoms (i.e., ions)

As used herein, the term "epi" is used to refer to an epitaxial layer, for example, an N-type epitaxial layer, disposed over a substrate, for example, a P-type substrate, and having a particular range of concentrations of N-type atoms (i.e. ions).

As used herein, the term "N+" or "NP" is used to refer to a region implanted and diffused into a semiconductor layer, for example, into a surface of the epitaxial layer furthest from the substrate, and having another particular range of concentrations of N-type atoms (i.e. ions).

As used herein, the term "Light-N" or simply "LN" is used to refer to a region implanted and diffused into a semiconductor layer, for example, into a surface of the epitaxial layer further from the substrate, and having a particular range of concentrations of N-type atoms (i.e. ions).

As used herein, the term "P-well" is used to refer to a region implanted and diffused into a semiconductor layer, for example, into a surface of the epitaxial layer further from the substrate, and having a particular range of concentrations of P-type atoms (i.e. ions).

As used herein, the term "P-type buried layer" or simply "PBL" is used to refer to a region implanted and diffused into a semiconductor layer, for example, implanted into the substrate and then upwardly diffused into the epitaxial (epi) layer (also referred to herein as an epi layer). The epi layer can be grown after PBL implant and diffusion steps, and the upward diffusion into epi layer can be performed during a field oxidation process.

As used herein, the term "N-type buried layer" or simply "NBL" is used to refer to a region implanted and diffused into a semiconductor layer, for example, implanted into the substrate and then upwardly diffused into the epitaxial (epi) layer. The epi layer can be grown after NBL implant and diffusion steps, and the upward diffusion into epi layer can be performed during a field oxidation process.

As used herein, the term "P+" or "PP" is used to refer to a region implanted and diffused into a semiconductor layer, for example, into a surface of the epitaxial layer furthest from the substrate, and having another particular range of concentrations of P-type atoms (i.e. ions).

As used herein, the concentrations of the above types of semiconductor structures can fall into the following ranges: substrate=about $1 \times 10^{15}$ P-type atoms per cm$^3$, for example, boron atoms.
epi=about $1 \times 10^{15}$ to about $6 \times 10^{15}$ N-type atoms per cm$^3$, for example, Arsenic atoms,
    where: $5 \times 10^{14}$ to $1 \times 10^{15}$ can be representative of a concentration of epi bulk doping, and $5 \times 10^{15}$ to $1 \times 10^{16}$ can be representative of a concentration at a surface region of the epi layer at about 2 um depth created by an additional epi implant step. (Alternatively, $1 \times 10^{15}$ to $6 \times 10^{15}$).
N+=about $1 \times 10^2$ N-type atoms per cm$^3$, for example, phosphorous atoms.
LN=about 1 to $2 \times 10^{17}$ atoms per cm$^3$, for example, phosphorous atoms.
P-well=about $1 \times 10^{16}$ P-type atoms per cm$^3$, for example, boron atoms.
PBL=about $1 \times 10^{18}$ to about $2 \times 10^{18}$ P-type atoms per cm$^3$, for example, boron atoms.
NBL=about $1 \times 10^{19}$ to about $1.5 \times 10^{19}$ N-type atoms per cm$^3$, for example, antimony atoms.
P+=about $3 \times 10^{19}$ to about $5 \times 10^{19}$ P-type atoms per cm$^3$, for example, boron atoms.

In some embodiments, the concentrations are outside of the above ranges or values, but within about +/− twenty percent of the above ranges or values.

It should be noted that reference is sometimes made herein to assemblies having a particular shape (e.g., rectangular or square). One of ordinary skill in the art will appreciate, however, that the techniques described herein are applicable to a variety of sizes and shapes.

Figure 1:
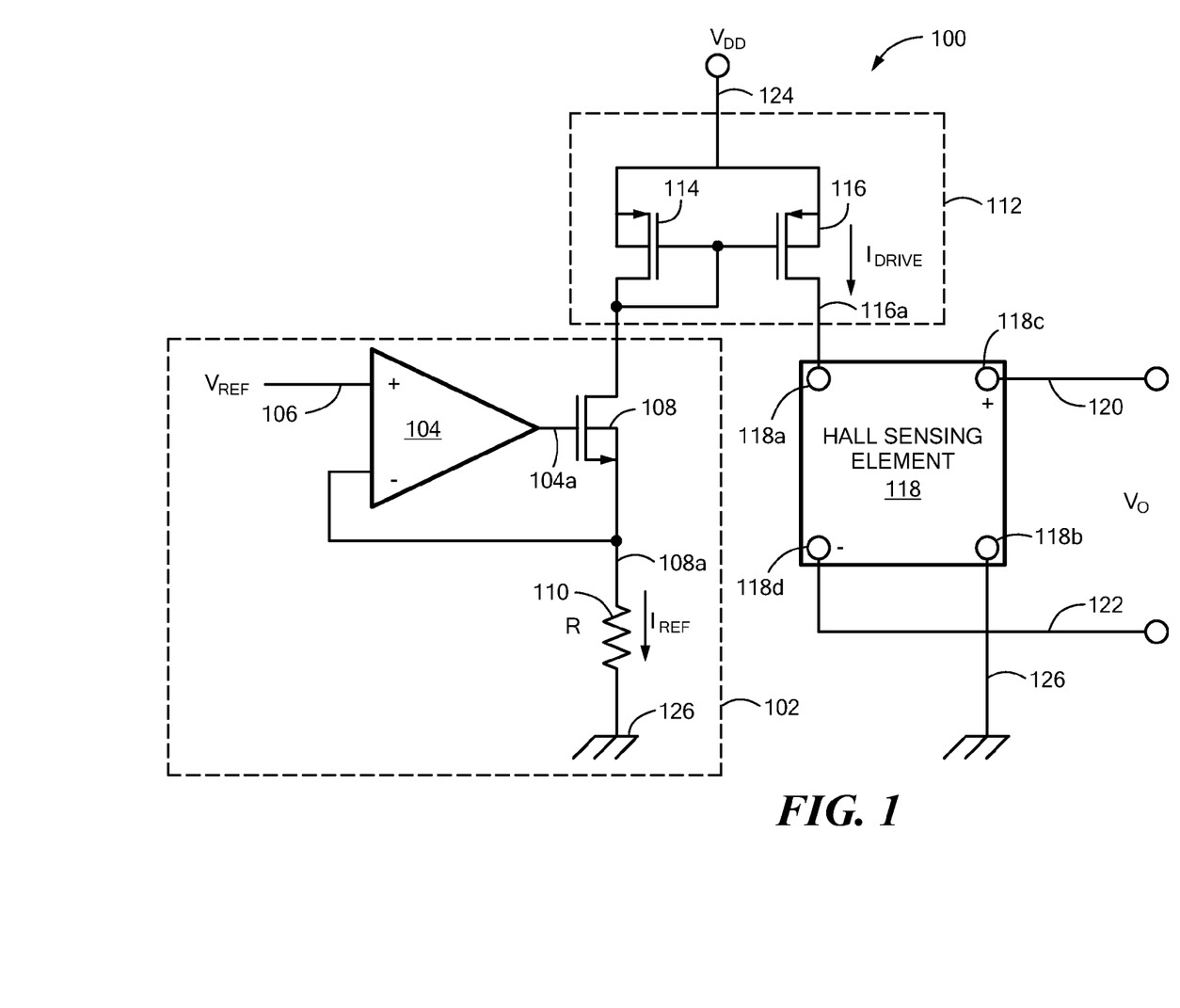
FIG. 1 is a block diagram showing an electronic circuit having a Hall effect element driven with a current generator and a current mirror, the current generator having a resistor that can be of a type shown in FIG. 2.

Referring to FIG. 1, an electronic circuit 100 includes a current generator 102 (a current sink) coupled to a current mirror 112, which is coupled to a Hall effect element 118.

The current generator 102 can include an operational amplifier 104. The operational amplifier 104 can be coupled to receive a reference voltage 106 at a noninverting terminal. The operational amplifier can generate a control signal 104a coupled to a transistor, for example, a field effect transistor (FET) 108, here shown to be an N-channel FET.

A source of the FET 108 can be coupled to an inverting terminal of the operational amplifier 104 and also coupled to a first end of a resistor 110. The other end of the resistor can be coupled to a voltage reference, for example, a ground 126. The resistor 110 has particular characteristics and is described more fully below in conjunction with FIGS. 2 and 3.

The current generator is operable to generate a reference current 108a that passes through the resistor 110, and also through the FET 108, i.e., into the drain of the FET 108. The reference current 108a is generated in accordance with a reference voltage (e.g., 108) generated across the resistor 110 due to a feedback arrangement around the operation amplifier 104. While the current generator 102 uses the operation amplifier 104 to achieve the reference voltage (e.g., 108) across the resistor 110 by way of feedback, it should be appreciated that there are other ways to achieve the reference voltage (e.g., 108) across the resistor 110 without using an operational amplifier.

A drain of the FET 108 can be coupled to the current mirror 112, and, in particular, to a drain of a first current mirror FET 114, here shown to be a P-Channel FET. A gate of the first current mirror FET can be coupled to the drain of the first current mirror FET 114 forming a diode structure.

The gate of the first current mirror FET 114 can be coupled to a gate of the second current mirror FET 116. A source of the first current mirror FET 114 can be coupled to a source of the second current mirror FET 116, which can both be coupled to receive the voltage 124. A drain of the second current mirror FET 116 can supply a drive current 116a.

In some embodiments, the drive current 116a has the same current value as the reference current 108a. However, it will be understood that, by scaling relative physical sizes of the first and second current mirror FETs 114, 116, the drive current 116a can be greater than or less than the reference current 108a.

The drive current 116a can be received by a first terminal 118a of the Hall effect element 118. The drive current 116a can pass from the first terminal 118a, through the Hall effect element 118, to a second terminal 118b. A voltage reference, for example, ground 126, can be coupled to receive the drive current 116a.

A differential output signal 120, 122 (a differential voltage) can be generated between the third and fourth terminals 118c, 118d, respectively, of the Hall effect element 118. The differential output signal 120, 122 is related to an amplitude of the drive current 116a, and also related to a magnitude of an external magnetic field.

It should be appreciated that the first terminal 118a has a higher voltage than the second terminal 118b. Thus, the first terminal 118a is referred to herein as a higher voltage terminal and the second terminal 118b is referred to herein as a lower voltage terminal.

As described above, in operation, a sensitivity of the Hall effect element 118 (i.e., sensitivity of the differential output signal 120, 122) is directly related to a value of the drive current 116a. As also described above, the sensitivity of the Hall effect element 118 (i.e., sensitivity of the differential output signal 120, 122) can vary or change directly with temperature. The sensitivity of the Hall effect element 118 can also vary or change in a way related to stresses upon a substrate in which the Hall effect element 118 is disposed, which stresses may or may not be related to temperature.

If the resistor 110 was merely a conventional resistor, there would be no compensation for the variation or change of the sensitivity of the Hall effect element 118 with respect to stresses of the substrate. However, as described more fully below in conjunction with FIGS. 2 and 3, the resistor 110 has a particular construction that makes a resistance of the resistor 110 change with stress of the substrate by an amount that generally compensates for changes in the sensitivity of the Hall effect element 118 with regard to stress, essentially by changing the drive current 116a as the stress changes. Changes in resistance of the resistor 110 result in changes in the reference current 108a, which result in changes of the drive current.

Current spinning or chopping is not shown in FIG. 1. However, it should be appreciated that the drive current 116a can pass between different pairs of the Hall effect element terminals, and the output voltage can be generated at other different pairs of the Hall effect element terminals, in a periodic and cyclic fashion to result in a reduction of offset voltage in the differential output signal 120, 122.

Figure 2:
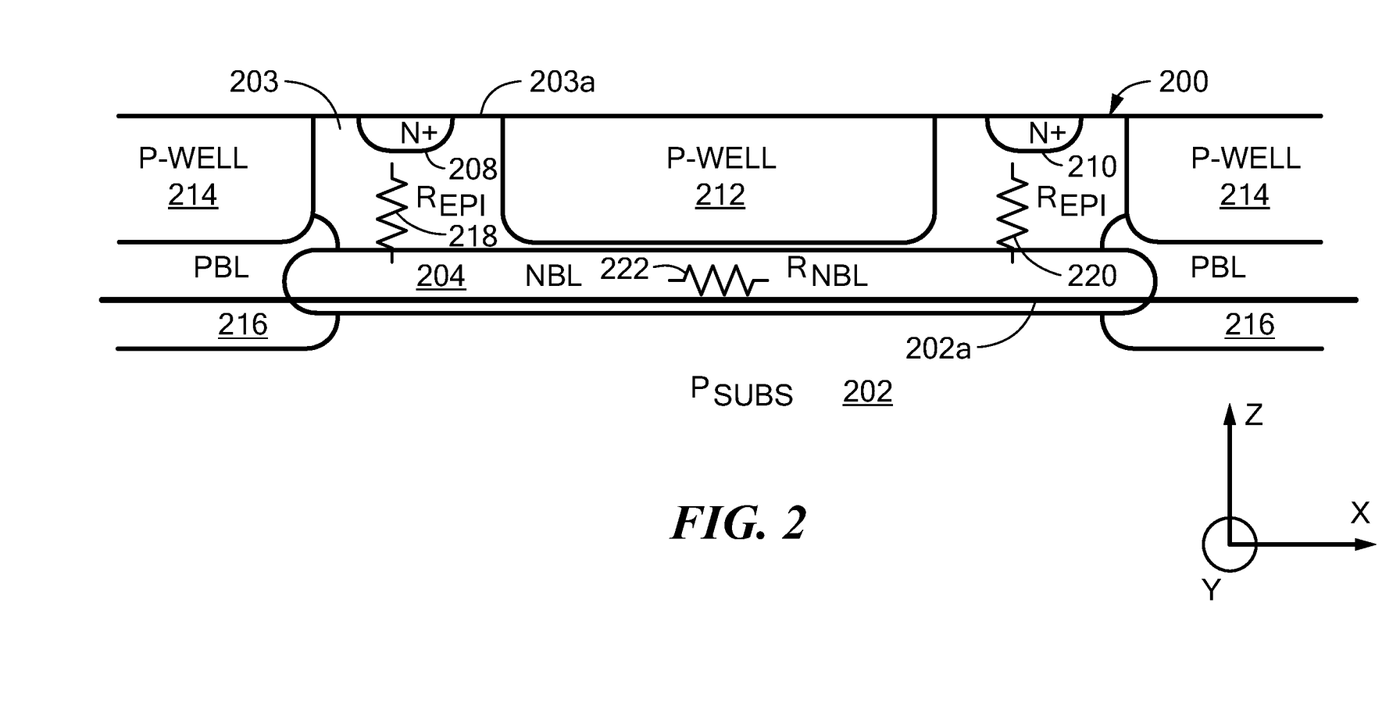
FIG. 2 is a block diagram showing a cross section of an example of the resistor of FIG. 1 disposed within an epitaxial layer over a substrate.

Referring now to FIG. 2, a resistor 200 can be the same as or similar to the resistor 110 of FIG. 1. Shown in a side cross-sectional view, the resistor 200 can be disposed in an N-type epitaxial layer 203, which is disposed upon P-type semiconductor substrate 202. The substrate 202 has a substrate surface 202a upon which the epitaxial layer 203 is disposed, for example with deposition fabrication techniques.

A PBL region 216 can join with a P-well region 214, forming an electrical barrier to electron flow, the barrier defining a perimeter boundary of the resistor 200.

Techniques for deposition and diffusion of the P-well region 216 and the PBL region 214 will be understood. However, let it suffice here to say that the PBL region 216 can be deposited onto the surface 202a of the substrate 202 before the epitaxial layer 203 is deposited upon the surface 202a of the substrate 202. The P-well region 214 can be deposited upon an outer surface 203a of the epitaxial layer 203, along with another P-well region 212. Heating of the resistor 200 causes the PBL region 216 to diffuse upward into the epitaxial layer 203 and downward into the substrate 202. Heating of the resistor 200 also causes the P-well regions 214, 212 to diffuse downward into the epitaxial layer 203.

An NBL region 204, formed in a way similar to formation of the PBL region 218, can be disposed within the epitaxial layer 203 and under the outer (top) surface 203a of the epitaxial layer 203

Two (or more) N+ pickups 208, 210 can be deposited and diffused into the surface of the epitaxial layer 203. The pickups 208, 210 can be used to form a two-terminal connection to the resistor 200, via metal contacts (not shown), formed in a metal layer (not shown), and that are in electrical communication with the pickups 208, 210.

The NBL region has a nominal resistance 222, which is a low resistance, for example, fifty Ohms.

The epitaxial layer 203 has resistances 218, 220, between the pickups 208, 210 and the NBL region 204. The resistances 218, 220 through the epitaxial layer 203 can have the same nominal resistance value, for example, about one thousand ohms.

The P-well region 212 can result in currents that flow through the resistances 218, 220 being directed substantially vertically to the surface 203a of the epitaxial layer 203.

The resistor 110 of FIG. 1 can be formed by passing the reference current 108a of FIG. 1 between the two pickups 208, 210. It will be understood that a resistance of the resulting resistor 200 is dominated by a series sum of the two resistances 218, 220.

The resistances 218, 220 have a piezo-resistance coefficient of about $53.1 \times 10^{-11}$ per Pascal to stress in the x and y directions, and thus, the resistances 218, 222 change value with stresses upon the substrate 202.

Calculations resulting in benefits of the resistor 200 having the above-described piezoelectric coefficient are described below in conjunction with FIG. 3.

Figure 3:
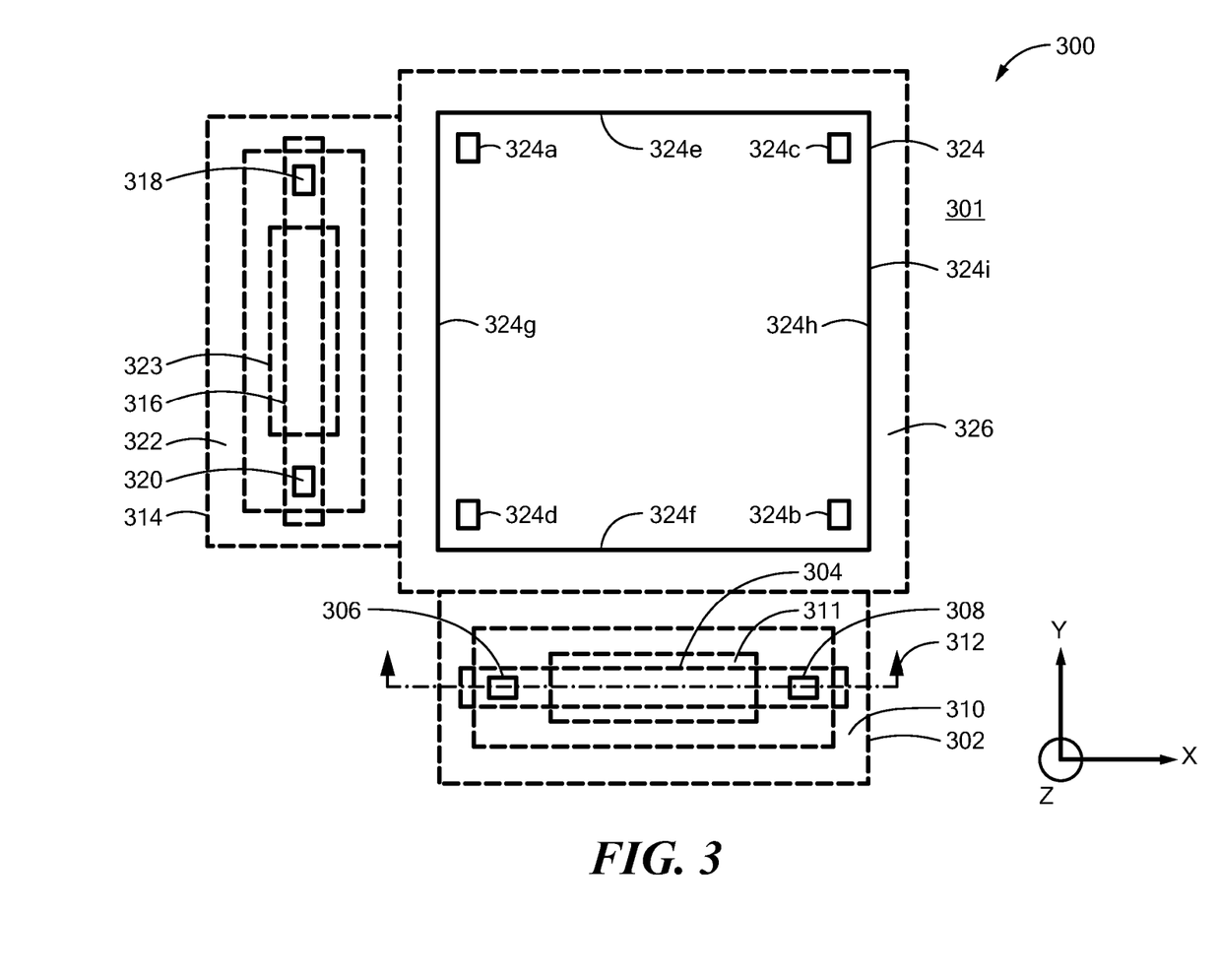
FIG. 3 is block diagram showing a top view of a substrate having a Hall effect element and two resistors of the type shown in FIG. 2

Referring Now to FIG. 3, an electronic circuit 300 is formed upon an epitaxial layer 301 over a substrate under the epitaxial layer 301.

The electronic circuit 300 can include a Hall effect element 324, shown in part as a bounded portion 324i of the epitaxial layer 301, bounded by an electrical barrier 326 to electron flow, the barrier defining a perimeter boundary of the Hall effect element 324. The electrical barrier 326 can be comprised of a PBL region under a P-well region, much the same as the PBL region 216 and the P-well region 214 of FIG. 2.

The bounded portion 324i can form a Hall plate of the Hall effect element 324. Over the bounded portion 324 can be a field plate, which, in some embodiments, can be formed in a metal layer. The field plate can have approximately the same dimensions in the x-y plane as the bounded portion 324i, thus reference designator 324i can be used to refer to either the Hall plate, i.e., bounded portion, in the epitaxial layer 321 or the field plate above the epitaxial payer 301.

The Hall effect 324 element can include four pickups 324a, 324b, 324c, 324d, which can be used and coupled in the same way, or in a similar way, as the four terminals 118a, 118b, 118c, 118d described above in conjunction with FIG. 1 FIG. 1. As described above in conjunction with FIG. 2, above the four pickups 324a, 324b, 324c, 324b can be a corresponding four contacts (not shown) formed in a metal layer.

The bounded portion 324i of the Hall effect element 324 can, in some embodiments, form a square shape having four sides or edges 324e, 324f, 324g, 324g. However, in other embodiments, the bounded portion 324i (and the Hall plate and field plate) need not have a square shape. For example, a Hall element with a wide cross shape is described I U.S. Pat. No. 8,357,983, issued Jan. 22, 2013, which is assigned to the assignee of the present invention and which is incorporated by reference herein in its entirety.

It should be understood that the Hall effect element 324 is a horizontal or planar Hall effect element, which has an axis of maximum sensitivity parallel to a z-axis.

The electronic circuit 300 can also include a resistor 302, which can be the same as or similar to the resistor 110 of FIG. 1 and the resistor 200 of FIG. 2.

The resistor 302 can include an NBL region 304, a P-well region 311, a barrier region 310, and two pickups 306, 308, which can be the same as or similar to the NBL region 204, the P-well region 212, the barrier region formed from the P-well region and the PBL region 214, 216, and the pickups 208, 210 of FIG. 2.

The NBL region 304 has a length with a length dimension parallel to the x-axis and a width with a width dimension parallel to the y-axis. The length dimension of the NBL region 304 can be parallel to the edge 324f of the Hall effect element 324. However, in other embodiments, the length dimension is not parallel to an edge of the Hall effect element 324.

While the width dimension of the NBL region 304 is shown to be less than the length dimension, in other embodiments, the width dimension can be equal to or greater than the length dimension.

In some embodiments, the resistor 302 is the only such resistor. However, in some embodiments, the resistor 302 can be a first resistor and the electronic circuit 300 can include a second resistor 314. The second resistor 314 can be coupled in series with or in parallel with the first resistor 302 to form one equivalent resistor that can be used as the resistor 110 of FIG. 1. When coupled in series, all of the reference current 108a of FIG. 1 passes through both resistors 302, 341. When coupled in parallel, at least a first portion of the reference current 108a passes through the first resistor 302 and a second portion of the reference current 108a passes through the second resistor 314. Portions of the reference current 108a that pass through the first and second resistors 302, 314 may be approximately equal, or they may be different.

The second resistor 314 can include an NBL region 316, a P-well region 323, a barrier region 322, and two pickups 318, 320, which can be the same as or similar to the NBL region 204, the P-well region 212, the barrier region formed from the P-well region and the PBL region 214, 216, and the pickups 208, 210 of FIG. 2.

The NBL region 316 has a length with a length dimension parallel to the y-axis and a width with a width dimension parallel to the x-axis. The length dimension of the NBL region can be parallel to the edge 324g of the Hall effect element 324. However, in other embodiments, the length dimension is not parallel to an edge of the Hall effect element 324. As shown, the length dimension of the NBL region 304 of the first resistor 302 is substantially perpendicular to the length dimension of the NBL region 316 of the second resistor 314. However, other relative orientations are also possible.

While the width dimension of the NBL region 316 is shown to be less than the length dimension, in other embodiments, the width dimension can be equal to or greater than the length dimension.

The electronic circuit 300 can form part of the electronic circuit 100 of FIG. 1. Transistors are not shown in FIG. 3, but it will be recognized that transistors (e.g., FETs) can be formed proximate to the electronic circuit 300 to form the electronic circuit 100 or any of the electronic circuits described in figures below.

Referring briefly again to FIG. 2, it is stated above that the piezoelectric coefficient of the resistances 218, 220 is about the same for stresses in the x-direction, in the y-direction, and in the z-direction. Having the first resistor 302 coupled in series or parallel with the second resistor 314 to result in an equivalent resistor can assure that the piezoelectric coefficient can remain more the same for stresses along different axes.

As described above in conjunction with FIG. 2, the resistances 218, 220 have a piezo-resistance coefficient of about 53.4×10$^{-11}$ per Pascal, and thus, the resistors 302, 314 change resistance value with stresses in the x and y direction upon the substrate 202 according to 53.4×10$^{-11}$ per Pascal.

The Hall effect elements 118, 324 have a piezo-Hall coefficient of about 45×10$^{-11}$ per Pascal for stresses in the x and y directions, which is close to the piezo-resistance coefficient above.

The change in sensitivity of the overall electronic circuit 300 (or more precisely, the circuit 100 of FIG. 1) due to stress of the substrate 301 is governed by piezo-Hall and piezo-resistive effects according to the above coefficients.

It can be shown that the change of sensitivity of the electronic circuit 100 of FIG. 1 with stress is approximately:

$$\frac{\Delta S}{S} = (45 \times 10^{-11} 1/\text{Pa} - 53.4 \times 10^{-11} 1/\text{Pa})(\sigma_x + \sigma_y) \quad (1)$$

where:
$\sigma_x$=stress parallel to the x-axis
$\sigma_y$=stress parallel to the y-axis
S=nominal sensitivity
$\Delta S$=change in sensitivity
Therefore:

$$\frac{\Delta S}{S} = -8.4 \times 10^{-11} 1/\text{Pa}\,(\sigma_x + \sigma_y) = -8.4\%/\text{GPa}(\sigma_x + \sigma_y) \quad (2)$$

where:
GPa=GigaPascals=10$^9$ Pascals

Were it not for compensation by the resistors described herein, the Hall effect element alone would be influenced by stress according to the following equation:

$$\frac{\Delta S}{S} \cong P_{12}(\sigma_x + \sigma_y) = \quad (3)$$

$$45 \times 10^{-11} 1/\text{Pa}\,(\sigma_x + \sigma_y) = 45\%/\text{GPa}\,(\sigma_x + \sigma_y)$$

where:
$P_{12}$=the above-described piezo-Hall coefficient

Thus, comparing equation (3) to equation (2), the resistors described herein, e.g., the resistor 200 of FIG. 2, result in a substantial reduction of sensitivity change due to stress.

While first and second resistors 302, 314 are shown, in other embodiments, there can be more than two such resistors, each responsive to changes in stress in the substrate, coupled in series or coupled in parallel or in any combination thereof.

Figure 4:
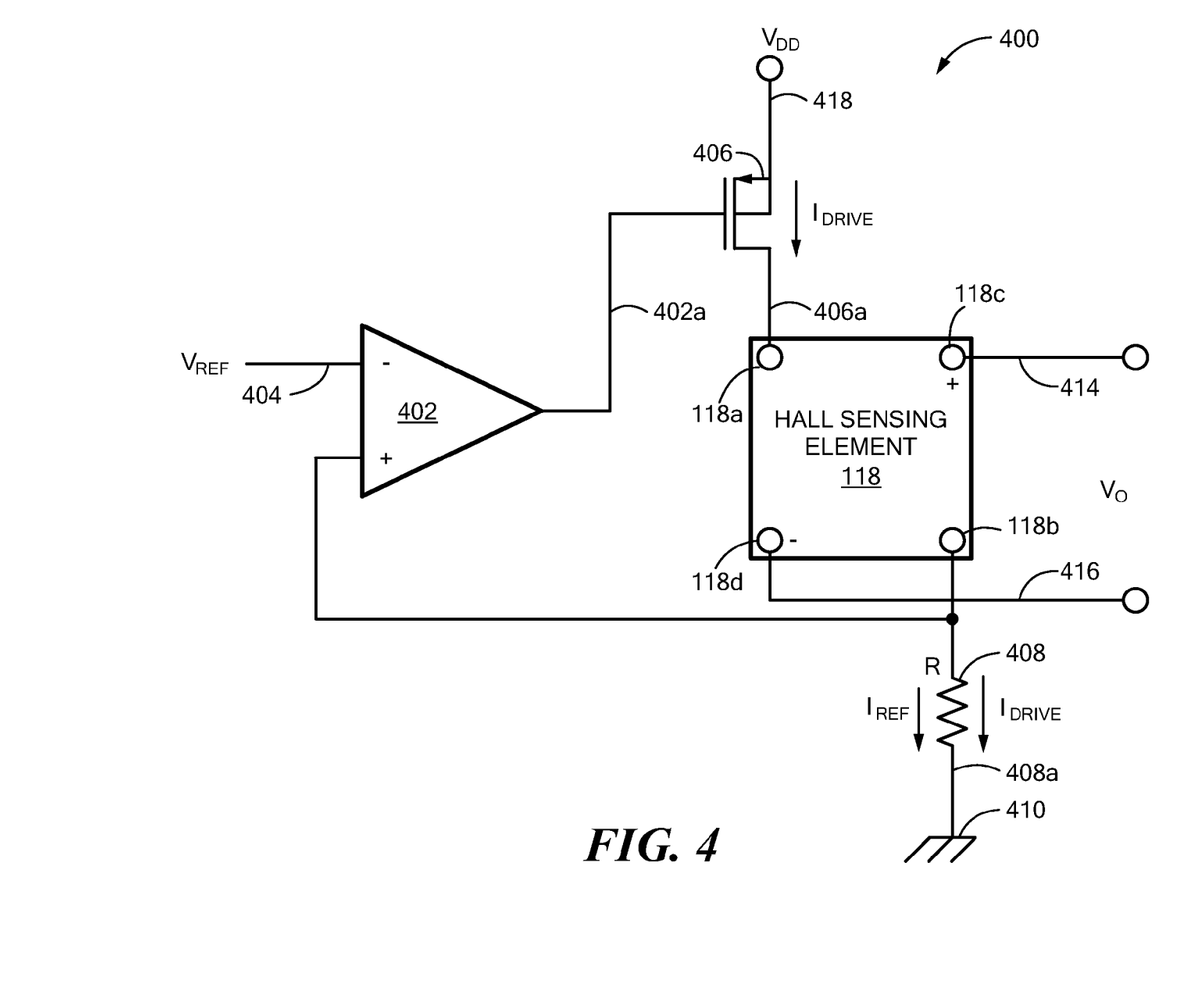
FIG. 4 is a block diagram showing another electronic circuit having a Hall effect element driven with a current generator, the current generator having a resistor that can be of a type shown in FIG. 2.

Referring now to FIG. 4, in which like elements of FIG. 1 are shown having like reference designations, another electronic circuit 400 can include an operation amplifier coupled to receive a reference voltage 404 at an inverting input.

The operational amplifier 402 is operable to generate a control signal 402a. An FET 406 can be coupled to receive the control signal 402a at a gate terminal thereof. A source terminal of the FET 406 can be coupled to receive a voltage 418. A drive current 406a can be output from a drain terminal 406 of the FET.

The drive current 406a can be received by the first terminal 118a of the Hall effect element 118. The drive current 406a can pass from the first terminal 118a, through the Hall effect element 118, to the second terminal 118b, and thereafter to a first terminal of a resistor 408, which can be the same as or similar to the resistor 110 of FIG. 1, and the same as or similar to the resistors described above in conjunction with FIGS. 2 and 3. A second terminal of the resistor 408 can be coupled to a voltage reference, for example, ground 410.

A differential voltage output signal 414, 416 can be generated between the third and fourth terminals 118c, 118d, respectively, of the Hall effect element 118. The differential voltage 414, 416 is related to an amplitude of the drive current 406a, and also related to a magnitude of an external magnetic field.

With the electronic circuit 400, it will be appreciated that the drive current 406a is essentially also a reference current generated by the electronic circuit 400 forming a current sink, but without the current mirror 112 of FIG. 1.

Operation of the electronic circuit 400 is similar to operation of the electronic circuit 100 of FIG. 1. As with the electronic circuit 100, the resistor 408 can be of a type described above in conjunction with FIGS. 2 and 3. The resistor 408 can compensate for variations in the sensitivity of the Hall effect element 118 that occur due to stress of the substrate on which the electronic circuit 400 is disposed.

Figure 5:
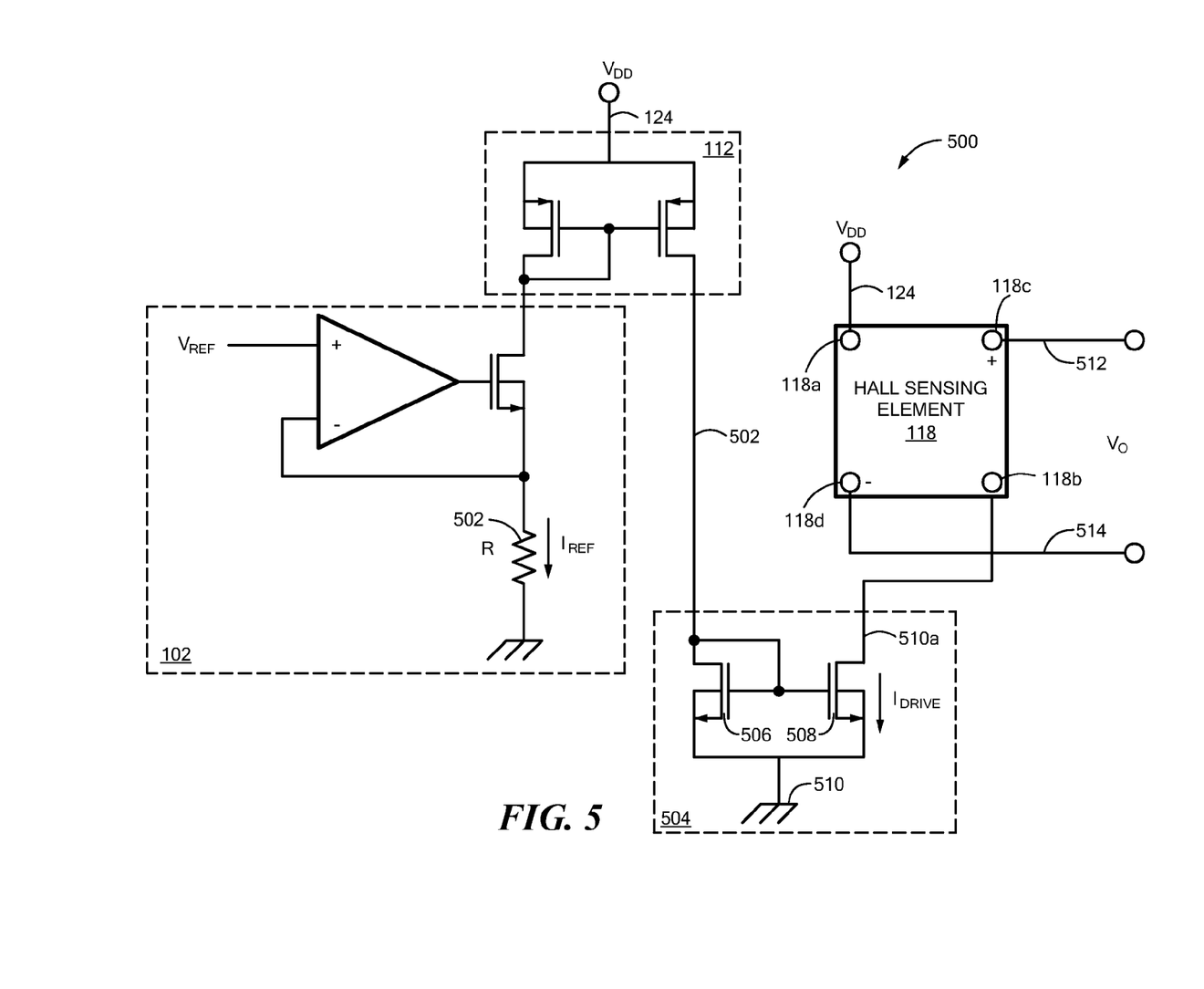
FIG. 5 is a block diagram showing another electronic circuit having a Hall effect element driven with a current generator and two current mirrors, the current generator having a resistor that can be of a type shown in FIG. 2.

Referring now to FIG. 5, in which like elements of FIG. 1 are shown having like reference designations, another electronic circuit 500 can include the current generator 102 and the current mirror 112 of FIG. 1. Here, however, the current mirror 112 is operable to generate an intermediate current 502 received by a second current mirror 504. In particular, a third current mirror FET 506, here shown to be an N-Channel FET, is coupled to receive the intermediate current 502 at a drain terminal. The drain terminal of the third current mirror FET 506 is coupled to the gate terminal of the third current mirror FET 506. The gate terminal of the third current mirror FET 506 is coupled to a gate terminal of a fourth current mirror FET 508. A source terminal of the third current mirror FET 506 is coupled to a source terminal of the fourth current mirror FET 508, both of which are coupled to a reference voltage, for example, a ground. A drain terminal of the fourth current mirror FET 508 is operable to generate (i.e., receive) a drive current 510*a*.

The Hall effect element 118 is coupled to receive a voltage 124 at the first terminal 118*a*. The second terminal 118*b* of the Hall effect elements 118 is coupled such that the drive current 510*a* is extracted therefrom.

Operation of the electronic circuit 500 is similar to operation of the electronic circuit 100 of FIG. 1. As with the electronic circuit 100, the resistor 110 can be of a type described above in conjunction with FIGS. 2 and 3. The resistor 110 can compensate for variations in the sensitivity of the Hall effect element 118 that occur due to stress of the substrate on which the electronic circuit 500 is disposed.

In some embodiments, the drive current 510*a* has the same current value as the reference current 108*a*. However, it will be understood that, by scaling relative drain-source resistances of the first, second, third and fourth current mirror FETs 114, 116, 506, 508, respectively, e.g., by scaling relative physical sizes, the drive current 510*a* can be greater than or less than the reference current 108*a*.

While field effect transistors are shown in embodiments above, in other embodiments any of the field effect transistors can be replaced with a bipolar junction transistor or another type of transistor.

While certain arrangements are shown above that use current mirrors, it should be understood that, in other arrangements, current mirrors can be arranged in different ways, for example, using more current mirrors.

With the above arrangements, changes in resistance of the resistors disposed in the epitaxial layer with stress of the substrate, and resulting changes of the drive current applied to the Hall effect element, can compensate for changes in the sensitivity of the Hall effect element with stress of the substrate. Accordingly, it should be appreciated that reference currents and drive currents described herein can change according to changes of stress experienced by the substrate.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An electronic circuit, comprising:
a semiconductor substrate having a surface;
epitaxial layer disposed over the surface of the semiconductor substrate, the epitaxial layer having a first surface distal from the semiconductor substrate and a second surface proximate to the semiconductor substrate;
a planar Hall effect element, at least a portion of the planar Hall effect element disposed in the epitaxial layer; and
a current generator configured to generate a drive current that passes through the planar Hall effect element, wherein the current generator comprises:
a first resistor for receiving a reference voltage resulting in a reference current passing through the first resistor, the reference current related to the drive current, the first resistor disposed in the epitaxial layer, wherein a resistance of the first resistor, the reference current, and the drive current change in accordance with changes of a stress in the semiconductor substrate, wherein the first resistor comprises:
first and second pickups implanted upon and diffused into the first surface of the epitaxial layer; and
a first buried structure disposed under the first surface of the epitaxial layer and under the first and second pickups, wherein the first buried structure has a density of atoms that results in a first low resistance path a first resistance lower than a resistance of the epitaxial layer, wherein the reference current passes from the first pickup, through a first region of the epitaxial layer, through the first buried structure, and through a second region of the epitaxial layer to the second pickup.

2. The electronic circuit of claim 1, wherein the reference current passes through the first and second regions of the epitaxial layer in a direction substantially perpendicular to the first surface of the epitaxial layer.

3. The electronic circuit of claim 2, wherein the first buried structure has a first length dimension and a first width dimension, the first length dimension parallel to the first surface of the epitaxial layer.

4. The electronic circuit of claim 3, wherein the first length dimension of the first buried structure is disposed parallel to a first edge of the planar Hall effect element and proximate to the Ball effect element.

5. The electronic circuit of claim 1, wherein the reference current is generated in accordance with the reference voltage coupled to the first pickup of the first resistor.

6. The electronic circuit of claim 1, wherein the first resistor is coupled to an operational amplifier to form a current source or a current sink.

7. The electronic circuit of claim 6, further comprising a current mirror coupled to the operational amplifier, wherein the current mirror comprises a reference leg through which the reference current passes, and a drive leg through which the drive current passes, wherein the drive current passing through the Hall effect element passes between a higher voltage terminal of the planar Hall effect element and a lower voltage terminal of the planar Hall effect element.

8. The electronic circuit of claim 7, wherein the drive leg of the current mirror is coupled to the higher voltage terminal.

9. The electronic circuit of claim 7, wherein the drive leg of the current mirror is coupled to the lower voltage terminal.

10. The electronic circuit of claim 1, wherein the current generator further comprises:
a second resistor coupled in series or in parallel with the first resistor, the second resistor disposed in the epitaxial layer, wherein the second resistor comprises:
third and fourth pickups implanted upon and diffused into the first surface of the epitaxial layer; and
a second buried structure disposed under the first surface of the epitaxial layer and under the third and fourth pickups, wherein the second buried structure has the density of atoms that results in a second low resistance path with a second resistance lower than the resistance of the epitaxial layer, wherein at least a portion of the reference current passes from the third pickup, through a third region of the epitaxial layer, through the second buried structure, and through a fourth region of the epitaxial layer to the fourth pickup.

11. The electronic circuit of claim 10, wherein,
when the first and second resistors are coupled in parallel, a first portion of the reference current passes through the first and second regions of the epitaxial layer in a direction substantially perpendicular to the first surface of the epitaxial layer and a second portion of the reference current passes through the third and fourth regions of the epitaxial layer in the direction substantially perpendicular to the first surface of the epitaxial layer, and wherein,
when the first and second resistors are coupled in series, the reference current passes through the first, second, third, and fourth regions of the epitaxial layer in a direction substantially perpendicular to the first surface of the epitaxial layer.

12. The electronic circuit of claim 11, wherein the first buried structure has a first length dimension and a first width dimension, the first length dimension parallel to the first surface of the epitaxial layer, and wherein the second buried structure has a second length dimension and a second width dimension, the second length dimension parallel to the first surface of the epitaxial layer.

13. The electronic circuit of claim 12, wherein the first length dimension of the first buried structure is disposed parallel to a first edge of the planar Hall effect element and proximate to the planar Hall effect element, and wherein the second length dimension of the second buried structure is disposed parallel to a second edge of the planar Hall effect element and proximate to the planar Hall effect element, wherein the second length dimension of the second buried structure is arranged perpendicular to the first length dimension of the first buried structure.

14. The electronic circuit of claim 13, wherein the first and second resistors are coupled in series.

15. The electronic circuit of claim 13, wherein the first and second resistors are coupled in parallel.

16. The electronic circuit of claim 13, wherein, the planar Hall effect element comprises a horizontal planar Hall effect element.

17. The electronic circuit of claim 10, wherein the reference current is generated in accordance with the reference voltage coupled to a series or parallel arrangement of the first and second resistors.

18. The electronic circuit of claim 10, wherein the first resistor and the second resistor are coupled to an operational amplifier to form a current source or a current sink.

19. The electronic circuit of claim 18, further comprising a current mirror coupled to the operational amplifier, wherein the current mirror comprises a reference leg through which the first portion and the second portion of the reference current pass, and a drive leg through which the drive current passes, wherein the drive current passing through the planar Hall effect element passes between a higher voltage terminal of the planar Hall effect element and a lower voltage terminal of the planar Hall effect element.

20. The electronic circuit of claim 19, wherein the drive leg of the current mirror is coupled to the higher voltage terminal.

21. The electronic circuit of claim 19, wherein the drive leg of the current mirror is coupled to the lower voltage terminal.

22. A method of biasing a planar Hall effect element, comprising:
generating a reference current by generating a voltage reference across a resistor disposed in an epitaxial layer over a semiconductor substrate, the epitaxial layer having a first surface distal from the semiconductor substrate and a second surface proximate to the semiconductor substrate; and
injecting a drive current into the planar Hall effect element, wherein the planar Hall effect element is disposed over the semiconductor substrate, wherein the drive current is related to the reference current, wherein a resistance of the resistor, the reference current, and the drive current change in accordance with changes of a stress in the semiconductor substrate; wherein the first resistor comprises:
first and second pickups implanted upon and diffused into the first surface of the epitaxial layer; and
a first buried structure disposed under the first surface of the epitaxial layer and under the first and second pickups, wherein the first buried structure has a density of atoms that results in a first low resistance path with a first resistance lower than a resistance of the epitaxial layer, wherein the reference current passes from the first pickup, through a first region of the epitaxial layer, through the first buried structure, and through a second region of the epitaxial layer to the second pickup.

23. The electronic circuit of claim 1, further comprising a diffused region disposed over the first buried structure and between the first and second pickups, the diffused region diffused into the epitaxial layer to a depth proximate to the first buried structure, the diffused region having a high resistance to a current flow.

24. The method of claim 22, further comprising diffusing a diffused region disposed over the first buried structure and between the first and second pickups, the diffused region diffused into the epitaxial layer to a depth proximate to the first buried structure, the diffused region having a high resistance to a current flow.

25. The electronic circuit of claim 10, further comprising a diffused region disposed over the second buried structure and between the third and fourth pickups, the diffused region diffused into the epitaxial layer to a depth proximate to the second buried structure, the diffused region having a high resistance to a current flow.

* * * * *

UNITED STATES PATENT AND TRADEMARK OFFICE
CERTIFICATE OF CORRECTION

PATENT NO. : 9,638,764 B2
APPLICATION NO. : 14/681575
DATED : May 2, 2017
INVENTOR(S) : Juan Manuel Cesaretti et al.

Page 1 of 1

It is certified that error appears in the above-identified patent and that said Letters Patent is hereby corrected as shown below:

On the Title Page

Column 1, items (71) and (73) Line 5 and 10, delete "Allegro Microsystems, LLC" and replace with --Allegro MicroSystems, LLC--

In the Specification

Column 2, Line 61, delete "FIG. 3 is block" and replace with --FIG. 3 is a block--

Column 2, Line 63, delete "in FIG. 2" and replace with --in FIG. 2;--

Column 4, Line 35, delete "atoms (i.e., ions)" and replace with --atoms (i.e., ions).--

Column 7, Line 28, delete "layer 203" and replace with --layer 203.--

Column 7, Line 41, delete "ohms." and replace with --Ohms.--

Column 7, Line 57, delete "Referring Now" and replace with --Referring now--

Column 8, Line 12-13, delete "FIG. 1 FIG. 1" and replace with --FIG. 1--

Column 8, Line 14, delete "324a, 324b, 324c, 324b" and replace with --324a, 324b, 324c, 324d--

Column 8, Line 18, delete "324e, 324f, 324g, 324g" and replace with --324e, 324f, 324g, 324h--

Column 8, Line 22, delete "is described I U.S." and replace with --is described in U.S.--

Signed and Sealed this
Twenty-second Day of May, 2018

Andrei Iancu
*Director of the United States Patent and Trademark Office*